United States Patent [19]

Meier et al.

[11] Patent Number: 5,371,115

[45] Date of Patent: * Dec. 6, 1994

[54] CATIONICALLY POLYMERIZABLE COMPOSITIONS CONTAINING IRON METALLOLENE SALT

[75] Inventors: Kurt Meier, Allschwil; Hans Zweifel, Basel, both of Switzerland

[73] Assignee: Ciba-Geigy Corporation, Ardsley, N.Y.

[*] Notice: The portion of the term of this patent subsequent to Dec. 17, 2008 has been disclaimed.

[21] Appl. No.: 870,156

[22] Filed: Apr. 15, 1992

Related U.S. Application Data

[60] Continuation of Ser. No. 784,603, Oct. 28, 1991, abandoned, which is a division of Ser. No. 698,978, Feb. 6, 1985, abandoned.

[30] Foreign Application Priority Data

Feb. 10, 1984 [CH] Switzerland ............ 632/84-4
Sep. 7, 1984 [CH] Switzerland ............ 4286/84-9

[51] Int. Cl.$^5$ ............ C08G 59/68; C08G 59/72; G03F 7/004; G03F 7/038
[52] U.S. Cl. ............ 522/13; 522/12; 522/18; 522/24; 522/26; 522/29; 522/166; 522/170; 430/280
[58] Field of Search ............ 522/24, 12, 13, 18, 522/26

[56] References Cited

U.S. PATENT DOCUMENTS

| | | | |
|---|---|---|---|
| 2,632,753 | 3/1953 | Anderson | 522/24 |
| 4,069,054 | 1/1978 | Smith | 522/31 |
| 4,156,035 | 5/1979 | Tsao | 204/159.11 |
| 4,250,203 | 2/1981 | Schlesinger | 427/44 |
| 4,256,828 | 3/1981 | Smith | 522/14 |
| 4,318,766 | 3/1982 | Smith | 522/25 |
| 4,348,530 | 9/1982 | Kvita et al. | 522/26 |
| 4,363,917 | 12/1982 | Fischer et al. | 522/26 |
| 4,459,414 | 7/1984 | Fischer et al. | 522/50 |
| 4,506,083 | 3/1985 | Kvita et al. | 549/27 |
| 4,533,446 | 8/1985 | Conway | 522/24 |
| 4,624,912 | 11/1986 | Zweifel | 522/31 |
| 5,073,476 | 12/1991 | Meier | 522/24 |
| 5,089,536 | 2/1992 | Palazzotto | 522/170 |

FOREIGN PATENT DOCUMENTS

| | | | |
|---|---|---|---|
| 94915 | 11/1983 | European Pat. Off. | 522/66 |
| 109851 | 5/1984 | European Pat. Off. | 522/66 |

OTHER PUBLICATIONS

S. L. Murov, Handbook of Photochemistry, M. Dekkar, New York, pp. 27 et seq. (1973).

*Primary Examiner*—Marion E. McCamish
*Assistant Examiner*—Arthur H. Koeckert
*Attorney, Agent, or Firm*—William A. Teoli, Jr.; Luther A. R. Hall

[57] ABSTRACT

A hardenable composition containing:
a) a material polymerizable by free radical or cationic polymerization,
b) at least one iron compound of the formula I $$[(R^1)(R^2Fe^{II})_a]^{+a} \frac{a}{q} (LQ_m)^{-q} \quad (I)$$

wherein
a is 1 or 2 and q is 1, 2 or 3,
L is a divalent to heptavalent metal or non-metal,
Q is a halogen atom,
m is an integer corresponding to the sum of the values of L and q,
$R^1$ is an unsubstituted or substituted $\eta^6$-benzene and
$R^2$ is an unsubstituted or substituted cyclopentadienyl anion, and
c) at least one sensitizer for the compound of the formula I,
and, in the case of materials polymerizable by free radical polymerization, also d) an electron acceptor as an oxidizing agent, which is also advantageously used concomitantly for the material polymerizable by cationic polymerization. The composition is suitable for the production of protective layers and photographic images.

5 Claims, No Drawings

CATIONICALLY POLYMERIZABLE COMPOSITIONS CONTAINING IRON METALLOLENE SALT

This application is a continuation of application Ser. No. 784,603, filed Oct. 28, 1991, abandoned, which is a divisional of Ser. No. 698,978 filed Feb. 6, 1985, now abandoned.

The present invention relates to a hardenable composition consisting of a) a material polymerizable by cationic or free radical polymerization, b) an iron(II)-$\eta^6$-benzene-$\eta^5$-cyclopentadienyl complex salt, c) a sensitizer for the compounds b), and d) an electron acceptor as an oxidizing agent for the material polymerizable by free radical polymerization, to a process for the polymerization of this material by the action of radiation, and to a material coated with the composition and its use.

Patent document EP-A-0,094,915 describes a hardenable composition consisting of a material polymerizable by cationic polymerization, which contains a ($\pi$-arene)-metal complex salt as the initiator. The composition can be hardened directly by the action of heat or first irradiated to activate the initiator and then hardened by the action of heat. For complete hardening, however, the period of exposure must be relatively long, which is uneconomic. It is therefore desirable to increase the photosensitivity. It is also desirable to avoid thermal hardening after irradiation and to effect the hardening by means of radiation alone. It has now been found that the photosensitivity can be substantially increased by the simultaneous use of a sensitizer in conjunction with selected ($\pi$-arene)-metal complex salts. It has furthermore been found that thermal hardening can be extensively avoided by the concomitant use of an oxidizing agent as well.

The present invention relates to a composition containing:
 a) a material polymerizable by free radical or cationic polymerization,
 b) at least one iron compound of the formula I

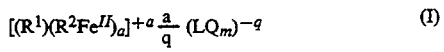

$$[(R^1)(R^2Fe^{II})_a]^{+a}\tfrac{a}{q}(LQ_m)^{-q} \qquad (I)$$

wherein
 a is 1 or 2 and q is 1, 2 or 3,
 L is a divalent to heptavalent metal or non-metal,
 Q is a halogen atom,
 m is an integer corresponding to the sum of the values of L and q,
 $R^1$ is an unsubstituted or substituted $\eta^6$-benzene and
 $R^2$ is an unsubstituted or substituted cyclopentadienyl anion, and
 c) at least one sensitizer for the compound of the formula I,
 and, in the case of materials polymerizable by free radical polymerization, also d) an electron acceptor as an oxidizing agent.

Advantageously, the composition including a material hardenable by cationic polymerization also contains an electron acceptor as an oxidizing agent, especially when used for hardening by irradiation.

The iron compound of the formula I, or the iron compound of the formula I and the oxidizing agent d), are preferably present in a quantity of 0.1–15% by weight, particularly 0.1–10% by weight and very particularly 0.1–5% by weight. The weight ratio of the iron compound of the formula I to the oxidizing agent d) is preferably 1:10 to 5:1, particularly 1:1 to 5:1. The sensitizer c) is preferably incorporated in a quantity of 0.1–10% by weight, particularly 0.1–5% by weight and especially 0.1–2.5% by weight.

As a mononuclear $\eta$-arene derived from benzene, $R^1$ in the formula I can be monosubstituted or polysubstituted by identical or different halogen atoms or $C_1$–$C_{12}$-alkyl, $C_2$–$C_{12}$-alkenyl, $C_2$–$C_{12}$-alkynyl, $C_1$–$C_8$-alkoxy, cyano, $C_1$–$C_{12}$-alkylthio, $C_2$–$C_6$-monocarboxylic acid ester, phenyl, $C_2$–$C_5$-alkanoyl or benzoyl groups.

The cyclopentadienyl anion $R^2$ can be monosubstituted or polysubstituted by identical or different $C_1$–$C_8$-alkyl, $C_2$–$C_8$-alkenyl, $C_2$–$C_8$-alkynyl, $C_2$–$C_6$-monocarboxylic acid ester, cyano, $C_2$–$C_5$-alkanoyl or benzoyl groups.

The abovementioned alkyl, alkoxy, alkylthio, monocarboxylic acid alkyl ester and alkanoyl substituents can be straight-chain or branched. Typical alkyl, alkoxy, alkylthio, monocarboxylic acid alkyl ester and alkanoyl substituents are, respectively, methyl, ethyl, n-propyl, isopropyl, n-butyl, sec.-butyl, tert.-butyl, n-pentyl, n-hexyl and n-octyl, methoxy, ethoxy, n-propoxy, isopropoxy, n-butoxy, n-hexyloxy and n-octyloxy, methylthio, ethylthio, n-propylthio, isopropylthio, n-butylthio, n-pentylthio and n-hexylthio, carboxylic acid methyl, ethyl, n-propyl, isopropyl, n-butyl and n-pentyl esters, and acetyl, propionyl, butyryl and valeroyl. The abovementioned alkyl, alkoxy, alkylthio and monocarboxylic acid alkyl ester groups preferably have 1 to 4 and especially 1 or 2 carbon atoms in the alkyl moieties and the abovementioned alkanoyl groups preferably have 2 or 3 carbon atoms. When $R^1$ is a substituted $\pi$-arene derived from benzene, it preferably contains one or two of the abovementioned substituents, especially chlorine or bromine atoms, methyl, ethyl, propyl, isopropyl, methoxy, ethoxy, cyano or carboxylic acid methyl or ethyl ester groups and acetyl groups.

Examples of suitable $\pi$-arenes derived from benzene are benzene, toluene, xylenes, ethylbenzene, methoxybenzene, ethoxybenzene, dimethoxybenzene, p-chlorotoluene, chlorobenzene, bromobenzene, dichlorobenzene, acetylbenzene, trimethylbenzene, trimethoxybenzene, 1,2-dihydronaphthalene, 1,2,3,4-tetrahydronaphthalene, mesitylene, cumene, biphenyl, anisole and dodecylbenzene. Preference is given to benzene, toluene, xylene, cumene, mesitylene, chlorobenzene, chlorotoluene, anisole, dimethoxybenzene, biphenyl, dodecylbenzene or tetralin.

$R^2$ is preferably the cyclopentadienyl anion or a $C_1$–$C_4$-alkylated cyclopentadienyl anion, particularly the methylcyclopentadienyl anion.

In the formula I, a is preferably 1.

Examples of suitable metals or non-metals L are Sb, Fe, Sn, Bi, Al, Ga, In, Ti, Zr, Sc, V, Cr, Mn and Cu; lanthanides such as Ce, Pr and Nd; or actinides such as Th, Pa, U or Np. Suitable non-metals are especially B, P and As. L is preferably P, As, B or Sb, P being particularly preferred. The halogen atom Q is preferably Cl and particularly F.

In the formula I, q is preferably 1, m is preferably 6, Q is preferably F and L preferably B, P, As or Sb.

Examples of complex anions $[LQ_m]^{-q}$ are $BF_4^{-}$, $PF_6^{-}$, $AsF_6^{-}$, $SbF_6^{-}$, $FeCl_4^{-}$, $SnCl_6^{-2}$, $SbCl_6^{-}$ and BiCl$_6^-$. The particularly preferred complex anions are SbF$_6^-$, BF$_4^-$, AsF$_6^-$ and PF$_6^-$.

The compounds of the formula I are known or can be prepared by analogous processes.

The electron acceptors as oxidizing agent d) are preferably an organic hydroperoxide, an organic peracid or a quinone.

Examples are: tertiary butyl hydroperoxide, cumene hydroperoxide, triphenylmethyl hydroperoxide, tetralin hydroperoxide, α-methyltetralin hydroperoxide, decalin hydroperoxide, perbenzoic acid, m-chloroperbenzoic acid or benzoquinone.

Examples of suitable sensitizers c) are those having a triplet energy of at least 30 and preferably of at least 35 kcal/mol. They can be selected, for example, from the group consisting of the monocyclic or polycyclic hydrocarbon aromatics or heteroaromatics, the phenones, particularly the acetophenones and the benzophenones, the benzils, the stilbenes, the xanthones and thioxanthones, the anthracenes, the phthalimides, particularly the phthalimide thioethers, and the diones with adjacent CO groups. Other suitable sensitizers and examples are mentioned in S. L. Murov, Handbook of Photochemistry, M. Dekker Inc., New York, pages 27 et seq. (1973).

Preferred sensitizers are thioxanthones, phthalimides, particularly phthalimide thioethers, coumarins and anthracenes. Suitable phthalimide thioethers are described in patent documents DE-A-31 17 589 and EP-A-0,062,615. Suitable thioxanthones are described, for example, in patent documents DE-A-30 18 891 and EP 0,033,720.

Particularly preferred sensitizers are unsubstituted or substituted anthracenes or mixtures of such anthracenes.

They can correspond to the formula II

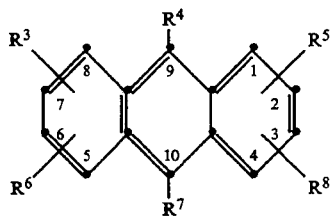

wherein $R^3$ to $R^8$ independently of one another are a hydrogen atom, halogen, cyano, linear or branched $C_1$-$C_{18}$-alkyl, $C_1$-$C_{18}$-alkoxy or $C_1$-$C_{18}$-alkylthio, $C_5$-$C_{12}$-cycloalkyl which is unsubstituted or substituted by $C_1$-$C_6$-alkyl, linear or branched $C_3$-$C_{18}$-alkenyl, $C_7$-$C_{16}$-aralkyl, —$C_nH_{2n}$—OZ, —$C_nH_{2n}$—CN, —$C_nH_{2n}$—COOR$^9$ or

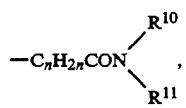

wherein n is a number from 1 to 18, $R^9$ is linear or branched $C_1$-$C_{18}$-alkyl, $C_5$-$C_{12}$-cycloalkyl which is unsubstituted or substituted by $C_1$-$C_6$-alkyl, $C_6$-$C_{12}$-aryl, $C_7$-$C_{16}$-alkaryl, $C_7$-$C_{16}$-aralkyl, $C_8$-$C_{16}$-alkaralkyl or a metal cation, $R^{10}$ and $R^{11}$ independently of one another are a hydrogen atom, $C_1$-$C_{18}$-alkyl or $C_5$-$C_{12}$-cycloalkyl, or $R^{10}$ and $R^{11}$ together are tetramethylene, pentamethylene or 3-oxapentylene, and Z is a hydrogen atom or $C_1$-$C_{18}$-alkyl.

In a preferred embodiment, at least one of the radicals $R^3$ to $R^8$ is one of the substituents defined previously. In another embodiment, $R^3$, and $R^5$,$R^6$ and $R^8$ are a hydrogen atom and $R^4$ and/or $R^5$ are $C_1$-$C_{18}$-alkyl or $C_1$-$C_{18}$-alkoxy. In another preferred embodiment, $R^4$ and $R^6$ to $R^8$ are a hydrogen atom and $R^3$ and $R^5$ are one of the substituents defined previously, $R^3$ being bonded especially in the 6-position or 7-position and $R^5$ in the 2-position.

Halogen $R^3$ to $R^8$ are preferably chlorine, ethyl, alkoxy and alkylthio $R^3$ to $R^8$ preferably contain 1 to 12 and particularly 1–6 C atoms and cycloalkyl $R^3$ to $R^8$ contain 5 or 6 ring carbon atoms. Alkenyl $R^3$ to $R^8$ preferably contain 3 to 8 C atoms. Aralkyl $R^3$ to $R^8$ are preferably phenylalkyl having especially 7 to 12 C atoms.

The number n is preferably 1 to 12 and particularly 1 to 6. Alkyl $R^9$ preferably contains 1 to 12 and particularly 1 to 6 C atoms and cycloalkyl $R^9$ preferably contains 5 or 6 ring carbon atoms. Aryl $R^9$ is preferably phenyl, alkaryl $R^9$ is preferably $C_7$-$C_{12}$-alkylphenyl, aralkyl $R^9$ is preferably $C_7$- to $C_{12}$-phenylalkyl and alkaralkyl $R^9$ is preferably $C_8$-$C_{12}$-alkylphenylalkyl. Metal cation $R^9$ is preferably selected from the alkali metal and alkaline earth metal group, for example Mg, Ca, K and particularly Na.

Alkyl $R^{10}$ and $R^{11}$ preferably contain 1 to 12 and particularly 1 to 6 C atoms. Cycloalkyl $R^{10}$ and $R^{11}$ preferably contain 5 or 6 ring carbon atoms. Alkyl Z preferably contains 1 to 12 and particularly 1 to 6 C atoms.

Examples of alkyl, alkoxy and alkylthio are: methyl, ethyl, n-propyl, i-propyl, n-butyl, i-butyl, t-butyl, 1-, 2- or 3-pentyl, 1-, 2- or 3-hexyl, heptyl, octyl, nonyl, decyl, undecyl, dodecyl, tetradecyl, hexadecyl or octadecyl and corresponding alkoxy and alkylthio radicals.

Examples of cycloalkyl are: cyclopentyl, methylcyclopentyl, cyclohexyl and methylcyclohexyl.

Examples of alkenyl are: allyl and prop-1-enyl.

Examples of aryl, aralkyl, alkaryl and alkaralkyl are: phenyl, benzyl, 2-phenylethyl, methylphenyl, ethylphenyl and methylbenzyl.

Some of the compounds of the formula II are known. Novel compounds of the formula II can be obtained by known processes, for example by Friedel-Crafts alkylation reactions carried out on anthracene or substituted anthracenes.

Examples are: perylene, 3,4-benzopyrene, 1,12-benzperylene, pyrene, pentaphene, 1,2-benzopyrene, fluoroanthrene, 1,2-benzochrysene, 1-aminonaphthalene, coronene, 1-nitronaphthalene, 3,4-benzofluorene, 2,2'-binaphthyl, 1-naphthaldehyde, 5,6-benzochrysene, 1-acetylnaphthalene, 3,4,5,6-dibenzophenanthrene, chrysene, 1,2- and 2,3-benzofluorene, 1-benzoylnaphthalene, 1-naphthonitrile, naphthalene-1-carboxylic acid, 1,2,6,7-dibenzopyrene, 9-acetylphenanthrene, 1-naphthol, 1-iodonaphthalene, 2-phenylnaphthalene, 3,4-benzophenanthrene, 3-acetylphenanthrene, 1-bromonaphthalene, 1-chloronaphthalene, 2-naphthonitrile, acenaphthene, 2-naphthaldehyde, naphthalene-2-carboxylic acid, 2-acetylnaphthalene, 2-benzoylnaphthalene, 1-methylnaphthalene, 1-methoxynaphthalene, 1-fluoronaphthalene, 2-iodonaphthalene, 2-bromonaphthalene, 2-chloronaphthalene, 2-naphthol, 2-methylnaphthalene, naphthalene, phenanthrene, anthraquinone, triphenylene, 4-benzoylpyridine, 2-benzoylpyridine, fluorene, 3-benzoylpyridine, carbazole, 4-acetylpyridine, 4-methoxybenzaldehyde, 4-methylbenzaldehyde, benzaldehyde, anthrone, 1-tetralone, 4-phenylacetophenone, 3,4-methylenedioxyacetophenone, 4-cyanoacetophenone, α-chloroacetophenone, 3,4,5-trimethylacetophenone, 3,5-dimethylacetophenone, 4-bromoacetophenone, 4-methoxyacetophenone, 3,4-dimethylacetophenone, triphenylmethylacetophenone, 4-chloroacetophenone, 4-trifluoromethylacetophenone, 2,4,6-trimethylacetophenone, 3-methoxyacetophenone, 3-methylacetophenone, 3-bromoacetophenone, 4-methylacetophenone, 3-cyanoacetophenone, 3-trifluoromethylacetophenone, acetophenone, allylacetophenone, benzophenone, 4-phenylbenzophenone, 4,4'-bisdimethylaminobenzophenone, 4-cyanobenzophenone, 4,4'-dichlorobenzophenone, 4-trifluoromethylbenzophenone, 3-methoxybenzophenone, 4-chlorobenzophenone, 3-chlorobenzophenone, 4,4'-dibromobenzophenone, 4-methoxybenzophenone, 3,4-dimethylbenzophenone, 4-methylbenzophenone, 2-methylbenzophenone, 4,4'-dimethylbenzophenone, 2,5-dimethylbenzophenone, 2,4-dimethylbenzophenone, 4-fluorobenzophenone, orthobenzylbenzophenone, 4,4'-dimethoxybenzophenone, 2-phenylbutyrophenone, α-phenylpriophenone, propiophenone, valerophenone, butyrophenone, benzil, trans-stilbene, cis-stilbene, diphenyltetraacetylene, tetraacetylene glycol, diethyltetraacetylene, diphenylacetylene, xanthone, thioxanthone, 2-isopropylthioxanthone, 2-chlorothioxanthone, 2-dodecylthioxanthone, 1-methoxycarbonylthioxanthone, 2-ethoxycarbonylthioxanthone, 3-(n-methoxyethoxycarbonyl)thioxanthone, 4-butoxycarbonylthioxanthone, 1-cyano-3-chlorothioxanthone, 2-ethoxycarbonyl-3-nitrothioxanthone, anthracene, 1-chloroanthracene, 2-methylanthracene, 9-methylanthracene, 2-tert.-butylanthracene, 9-methoxyanthracene, 9,10-dimethoxyanthracene, 2,6- or 2,7-dimethylanthracene, 2-t-butylanthracene, 2,6- or 2,7-di-t-butylanthracene, 2-(methoxycarbonylmethyl)anthracene, 2-(5-methoxycarbonyl-2-methylpent-2-yl)anthracene, 2,6- or 2,7-di(5-methoxycarbonyl-2-methylpent-2-yl)anthracene, 1,2-benzanthracene, 1,2,3,4-dibenzanthracene, 1,2,5,6-dibenzoanthracene, 1,2,7,8-dibenzoanthracene, 3-thiophenylphthalimide, N-methyl-4-thiophenylphthalimide, 2,3-butane dione.

Examples of organic materials polymerizable by cationic polymerization and suitable for the hardenable compositions according to the invention are of the following types, it being possible for these to be used by themselves or as mixtures of at least two components:

I. Ethylenically unsaturated compounds polymerizable by a cationic mechanism. These include:
1. Monoolefins and diolefins, for example isobutylene, butadiene, isoprene, styrene, α-methylstyrene, divinylbenzenes, N-vinylpyrrolidone, N-vinylcarbazole and acrolein.
2. Vinyl ethers, for example methyl vinyl ether, isobutyl vinyl ether, trimethylolpropane trivinyl ether and ethylene glycol divinyl ether; and cyclic vinyl ethers, for example 3,4-dihydro-2-formyl-2H-pyran (acrolein dimer) and the 3,4-dihydro-2H-pyran-2-carboxylic acid ester of 2-hydroxymethyl-3,4-dihydro-2H-pyran.
3. Vinyl esters, for example vinyl acetate and vinyl stearate.

II. Heterocyclic compounds polymerizable by cationic polymerization, for example ethylene oxide, propylene oxide, epichlorohydrin, glycidyl ethers of monohydric alcohols or phenols, for example n-butyl glycidyl ether, n-octyl glycidyl ether, phenyl glycidyl ether and cresyl glycidyl ether; glycidyl acrylate, glycidyl methacrylate, styrene oxide and cyclohexene oxide; oxetanes such as 3,3-dimethyloxetane and 3,3-di (chloromethyl)oxetane; tetrahydrofuran; dioxolanes, trioxane and 1,3,6-trioxacyclooctane; lactones such as β-propiolactone, γ-valerolactone and ε-caprolactone; thiiranes such as ethylene sulfide and propylene sulfide; azetidines such as N-acylazetidines, for example N-benzoylazetidine, as well as the adducts of azetidine with diisocyanates, for example toluylene-2,4-diisocyanate and toluylene-2,6-diisocyanate and 4,4'-diaminodiphenylmethane diisocyanate; epoxy resins; and linear and branched polymers with glycidyl groups in the side-chains, for example homopolymers and copolymers of polyacrylate and polymethacrylate glycidyl esters.

Of particular importance among these abovementioned polymerizable compounds are the epoxy resins and especially the diepoxides and polyepoxides and epoxy resin prepolymers of the type used to prepare crosslinked epoxy resins. The diepoxides and polyepoxides can be aliphatic, cycloaliphatic or aromatic compounds. Examples of such compounds are the glycidyl ethers and β-methylglycidyl ethers of aliphatic or cycloaliphatic diols or polyols, for example those of ethylene glycol, propane-1,2-diol, propane-1,3-diol, butane-1,4-diol, diethylene glycol, polyethylene glycol, polypropylene glycol, glycerol, trimethylolpropane or 1,4-di-methylolcyclohexane or of 2,2-bis(4-hydroxycyclohexyl)propane and N,N-bis(2-hydroxyethyl)aniline; and the glycidyl ethers of diphenols and polyphenols, for example resorcinol, 4,4'-dihydroxydiphenylmethane, 4,4'-dihydroxydiphenyl-2,2-propane, novolaks and 1,1,2,2-tetrakis(4-hydroxyphenyl)ethane. Further examples are N-glycidyl compounds, for example the diglycidyl compounds of ethyleneurea, 1,3-propyleneurea, 5-dimethylhydantoin or 4,4'-methylene-5,5'-tetramethyldihydantoin, or those like triglycidyl isocyanurate.

Other glycidyl compounds of industrial importance are the glycidyl esters of carboxylic acids, especially dicarboxylic and polycarboxylic acids. Examples of these are the glycidyl esters of succinic acid, adipic acid, azelaic acid, sebacic acid, phthalic acid, terephthalic acid, tetrahydrophthalic and hexahydrophthalic acids, isophthalic acid or trimellitic acid, or of fatty acid dimers.

Examples of polyepoxides other than glycidyl compounds are the diepoxides of vinylcyclohexene and dicyclopentadiene, 3-(3', 4'-epoxycyclohexyl)-8,9-epoxy-2,4-dioxaspiro[5,5]undecane, the 3',4'-epoxycyclohexylmethyl ester of 3,4-epoxycyclohexanecarboxylic acid, butadiene diepoxide or isoprene diepoxide, epoxidized linoleic acid derivatives or epoxidized polybutadiene.

Preferred epoxy resins are diglycidyl ethers (which may or may not have been lengthened beforehand) of dihydric phenols or dihydric aliphatic alcohols having 2 to 4 carbon atoms. Particular preference is given to the diglycidyl ethers (which may or may not have been lengthened beforehand) of 2,2-bis(4-hydroxyphenyl)-propane and bis(4-hydroxyphenyl)methane.

The following are also suitable as compounds polymerizable by cationic polymerization:

III. Methylol compounds:
1. Aminoplasts such as the N-hydroxymethyl, N-methoxymethyl, N-n-butoxymethyl and N- acetoxymethyl derivatives of amides or related compounds, for example cyclic ureas such as ethyleneurea (imidazolidin-2-one), hydantoin, urone (tetrahydrooxadiazin-4-one), 1,2-propyleneurea (4-methylimidazolidin-2-one), 1,3-propyleneurea (hexahydro-2H-pyrimidin-2-one), hydroxypropyl eneurea (5-hydroxyhexahydro-2H-pyrimidin-2-one), 1,3,5-melamine and other polytriazines such as acetoguanamine, benzoguanamine and adipoguanamine.

If desired, it is also possible to use aminoplasts which contain both N-hydroxymethyl and N-alkoxymethyl groups or both N -hydroxymethyl and N-acetoxymethyl groups (for example a hexamethylolmelamine in which 1 to 3 of the hydroxyl groups are etherified with methyl groups).

Preferred aminoplasts are the condensation products of urea, urone, hydantoin or melamine with formaldehyde, and partially or completely etherified products of these condensation products with an aliphatic monohydric alcohol having 1 to 4 carbon atoms.

2. Phenoplasts

Preferred phenoplasts are resols prepared from a phenol an d an aldehyde. Suitable phenols include phenol itself, resorcinol, 2,2-bis(p-hydroxyphenyl)propane, p-chlorophenol, a phenol substituted by one or two alkyl groups each having 1 to 9 carbon atoms, such as o-, m- and p-cresol, the xylenols, p-tert.-butylphenol and p-nonylphenol, and also phenyl-substituted phenols, especially p-phenylphenol. The aldehyde condensed with the phenol is preferably form aldehyde, but other aldehydes, such as acetaldehyde and furfurol, are also possible. If desired, a mixture of hardenable phenol-/aldehyde resins of these types can be used.

The preferred resols are condensation products of phenol, p-chlorophenol, resorcinol or o-, m- or p-cresol with formaldehyde.

Suitable organic materials polymerizable by free radical polymerization are, in particular, monoethylenically or polyethylenically unsaturated compounds. Examples are: styrene, vinylpyridine, vinyl acetate, divinylbenzene, vinyl ether, acrylamide, methacrylamide, bisacrylamide, bismethacrylamide and unsaturated polyesters, especially those based on maleic acid. Preferred materials are the esters or amides of acrylic acid and/or meth acrylic acid with linear or branched alcohols or polyols or, respectively, with monoamines or polyamines. Partial esters may also be used in the case of the polyols and polyamines.

Examples of polyamines a re ethylenediamine, propylenediamine, butylenediamine, hexylenediamine, phenylenediamine, benzylenediamine, naphthylenednamine, diethylenetriamine, triethylenetetramine and diaminoethyl ether. Examples of polyols are linear and branched alkylenediols such as ethylenediol, propylenediol, butylenediol, pentylenediol, hexylenediol and octylenediol, polyoxaalkylenediols such as diethylene glycol and triethylene glycol and polyethylene glycols with a molecular weight of 200 to 500, 1,4-dihydroxycyclohexane, 1,4-di(hydroxymethyl) cyclohexane, dihydroxybenzenes, hydroxymethylphenols, triols such as 1,2,3-trihydroxypropane, 1,2,4-trihydroxybutane and trimethylolpropane, pentaerythritol, dipentaerythritol and low-molecular polyesters with terminal hydroxyl groups.

Examples of suitable alcohols and monoamines are methanol, ethanol, propanol , butanol, pentanol, hexanol, heptanol, octanol, 2-ethylhexanol, cyclohexanol, phenol, glycidol, methylamine, dimethylamine and ethylamine.

Preferred organic materials polymerizable by free radical polymerization a re partial esters of epoxy resins and acrylic acid, methacrylic acid or a mixture of these acids, and acrylic acid esters and/or methacrylic acid esters of polyols.

The hardenable compositions according to the invention can be obtained, for example, as homogeneous liquid mixtures or in the form of homogeneous or inhomogeneous glasses. Homogeneous glass-like products can be obtained in a manner known per se, for example by the liquefaction of solid polymerizable organic materials, if appropriate with the addition of suitable solvents, in the dark or under red light, heating to temperatures above their glass transition temperature, the addition of components b) and c) and if appropriate d), and cooling of the mixtures formed. If desired, the resulting glass-like products can then be comminuted. Inhomogeneous glass-like products can be obtained, for example, by mixing glass-like polymerizable materials in powder form with components b) and c) and if appropriate d).

The compositions according to the invention are stable, and thus capable of being stored, at room temperature and under yellow light conditions. They can be hardened directly by the action of heat, advantageously at temperatures near the melting point or decomposition point of components b) and c) and if appropriate d). They have a high photosensitivity and at the same time are stable to yellow light in the case of sensitizers which absorb light in the region below 400 nm.

An essential advantage of the composition according to the invention which contains component d) is that it can be hardened by the action of radiation, complete hardening generally being effected by the heat of reaction produced, and external heating being superfluous. However, it can sometimes be advantageous also to apply external heat after exposure, for example if shorter reaction times are desired.

The present invention thus relates also to a process for the polymerization of an organic material polymerizable by free radical or cationic polymerization, under the action of radiation, in the presence of a photoinitiator and, if appropriate, with heating, wherein the photoinitiator is a mixture of a) at least one iron compound of the formula I

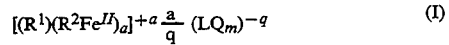

wherein a is 1 or 2 and q is 1, 2 or 3,

L is a divalent to heptavalent metal or non-metal,

Q is a halogen atom, m is an integer corresponding to the sum of the values of L and q, $R^1$ is η6-benzene and $R^2$ is an unsubstituted or substituted cyclopentadienyl anion, b) at least one sensitizer for the compound of the formula I and c) at least one electron acceptor as an oxidizing agent, and, if appropriate, the polymerization reaction is then completed by the application of heat.

These hardenable mixtures are advantageously irradiated with electron beams or actinic light, preferably having a wavelength of 200 t o 600 nm and an intensity of 150 to 5000 Watts. Examples of suitable light sources are xenon lamps, argon lamps, tungsten lamps, carbon arcs, metal halide lamps and metal arc lamps such as low-pressure, medium-pressure and high-pressure mercury discharge lamps. The irradiation is preferably carried out with metal halide lamps or high-pressure mercury discharge lamps. The irradiation time depends on a variety of factors including, for example, the polymerizable organic material, the type of light source and its distance from the material irradiated. The irradiation time is preferably 10 to 60 seconds.

The exposed compositions can be heated in conventional convection ovens. If short heating or reaction times are required, the heating can be effected by exposure with, for example, IR radiation, IR lasers or microwave devices. The polymerization temperatures are in the range from room temperature to about 80° C.

The compositions according to the invention can also contain other known additives normally used in the technology of photopolymerizable materials. Examples of these additives are pigments, dyes, fillers and reinforcements, glass fibres and other fibres, flame retardants, antistatic agents, flow control agents, antioxidants and light stabilizers, as well as conventional photo initiators such as acetophenones, acylphosphine oxides or aromatic ketones. To improve the final properties of epoxy resins, it is possible to incorporate polyfunctional hydroxyl compounds, for example those described in German Offenlegungsschrift 26 39 395.

To increase the storage stability in the dark, the hardenable compositions can contain weak organic bases such as nitriles, amides, lactones or urea derivatives. To prevent premature reaction through unintentional exposure, small quantities o f UV absorbers and/or organic dyes can be added.

The composition according t o the invention can be applied by usual methods to at least one surface of a substrate. The coated material also forms a subject of the invention. Examples of suitable substrates are metals and metalloids, such as steel, aluminium, copper, cadmium, zinc and silicon, as well as ceramic, glass, plastics, paper and wood. The coated material can be used to prepare protective layers and passivating layers by exposure, and this forms a further subject of the invention.

If, on exposure, only part of the coating is irradiated through a photomask, the unexposed areas can subsequently be removed with a suitable solvent. Thus, the coated material is also suitable as a photographic recording material, for the production of printing plates and particularly printed circuits, and as a solder resist. The use as a photographic recording material also forms a subject of the present invention.

The compositions according to the invention which contain a material polymerizable by cationic polymerization and which do not contain any oxidizing agents d) can be hardened by processes described in patent document EP-A-O, 094,915. These compositions can be harden ed directly by the action of heat. A two-step polymerization process is preferable, the iron complex of the formula I initially being activated by irradiation and the resulting activated precursors then being hardened by the action of heat, for example at temperatures from about 50° to 120° C. If irradiation is carried out through a photomask, photographic images can be produced. The irradiation time is approximately between 5 and 60 seconds and the thermal hardening time is approximately between 30 seconds and 5 minutes. These compositions according to the invention are characterized by a high photosensitivity.

The compositions according to the invention can also be used as adhesives or for the manufacture of putties, fillers or fibre-reinforced composites and laminates.

The compositions according to the invention have a high photosensitivity, which also means short exposure times for the hardening process. Initiators having a cationic action and a free radical action are produced simultaneously on exposure, which broadens the range of applications in respect of the polymerizable materials. It is surprising here that the oxidizing agent only becomes active after exposure and permits hardening by irradiation. It is a great advantage that the hardening is generally effected by the action of radiation, without the external application of heat.

The examples which follow illustrate the invention in greater detail.

Example a ($\eta^6$-Toluene) ($\eta^5$-cyclopentadienyl)iron(II) hexafluorophosphate is prepared according to Bull. Soc. Chim. France, 2572 (1975).

Example b ($\eta^6$-Anisole)($\eta^5$-cyclopentadienyl)iron(II) hexafluorophosphate is prepared according to Dokl. Akad. Nauk SSSR, 175, 609 (1967).

Example c ($\eta^6$-p-Dimethoxybenzene)($\eta^5$-cyclopentadienyl)iron(II) tetrafluoroborate is prepared according to J. Chem. Soc. C, 116 (1969).

Example d ($\eta^6$-p-Chlorotoluene) ($\eta^5$-cyclopentadienyl)iron(II) hexafluorophosphate is prepared according to J. Organomet. Chem. 20, 169 (1969).

Example e ($\eta^6$-Isopropylbenzene) ($\eta^5$-cyclopentadienyl)iron(II) hexafluorophosphate is prepared according to C. R. Acad. Sc. Paris, Ser. C, 272, 1337 (1971).

Example f ($\eta^6$-Isopropylbenzene) ($\eta^5$-cyclopentadienyl)iron(II) hexafluoroantimonate is prepared according to Example e, but using potassium hexafluoroantimonate.

Example g ($\eta^6$-Isopropylbenzene)($\eta^5$-cyclopentadienyl)iron(II) hexafluoroarsenate is prepared according to Example e, but using potassium hexafluoroarsenate.

Example h ($\eta^6$-Biphenyl) ($\eta^5$-cyclopentadienyl)iron(II) hexafluorophosphate is prepared according to J. Chem. Soc. Chem. Comm. 907 (1972 ).

Example i ($\eta^6$-Tetralin)($\eta^5$-cyclopentadienyl)iron(II) hexafluorophosphate is prepared according to J. Organomet. Chem. 101, 221 (1975).

Application Examples

Example 1

A solution consisting of 10 g of an industrial epoxy-cresol novolak (epoxy content 4.5 eq/kg), 0.25 g ($7 \times 10^4$ mol) of ($\eta^6$-toluene)($\eta^5$-cyclopentadienyl)iron-(II) hexafluorophosphate (prepared according to Example a), 0.25 ($1.3 \times 10^{-3}$ mol) of 9-methylanthracene and 4 g of 1-acetoxy-2-ethoxyethane is applied to a copper-coated epoxy board with a 25μ wire doctor. The initially wet film is dried at 80° C. (dry film thickness approx. 15μ). The photo-polymeric board prepared in this way is exposed with a 5000 Watt high-pressure mercury discharge lamp located 50 cm from the sample bench, a 21 step Stouffer sensitivity guide being used as the pattern (cf. W. S. DeForest, Photoresist, McGraw-Hill Book Comp., New York, page 109 et seq.). The exposure time is 30 seconds and the exposed board is then hardened for 2 minutes at 110° C. It is developed in 1-acetoxy-2-ethoxyethane, the unexposed parts being dissolved. This results in a relief image, no. 5 being the last step of which an image is formed.

Examples 2 to 14

The procedure of Example 1 is followed using different initiators and sensitizers.

The results are collated in Table 1. The content of initiator (arene-ferrocenium complex) is always 2.5 percent by weight based on the epoxycresol novolak, and the corresponding sensitizer concentration is always 1.3 mmol based on the epoxycresol novolak. Exposure is carried out for 10, 20 and 30 seconds in each case.

TABLE 1

| Example No. | Initiator (according to Example No.) | Sensitizer | Last step of which an image is formed after an exposure time of 10 | 20 | 30 sec. |
|---|---|---|---|---|---|
| 1 | a | 9-methylanthracene | 2 | 4 | 5 |
| 2 | a | 2-methylanthracene | 3 | 4 | 6 |
| 3 | b | 9-methylanthracene | 3 | 4 | 6 |
| 4 | c | 9-methylanthracene | 3 | 4 | 6 |
| 5 | d | 9,10-diethoxyanthracene | 3 | 5 | 6 |
| 6 | e | 2-methylanthracene | 2 | 4 | 6 |
| 7 | f | 2-methylanthracene | 12 | 14 | 16 |
| 8 | g | 2-methylanthracene | 9 | 11 | 14 |
| 9 | h | 9,10-diethoxyanthracene | 3 | 5 | 6 |
| 10 | i | 9-methylanthracene | 2 | 4 | 5 |
| 11 | a | 2,6-di-t-butylanthracene | 2 | 4 | 5 |
| 12 | a | 2,7-di-t-butytanthracene | 2 | 3 | 5 |
| 13 | a | 2,6-di(5-methoxy-carbonyl-2-methylpent-2-yl)-anthracene | 3 | 4 | 6 |
| 14 | a | 2,7-di(5-methoxy-carbonyl-2-methylpent-2-yl)-anthracene | 3 | 4 | 6 |

What is claimed is:

1. A composition containing:
   a) a material polymerizable by cationic polymerization
   b) at least one iron compound of the formula I $$[(R^1)(R^2)Fe^{II})_a]^{+a} \frac{a}{q} (LQ_m)^{-q} \qquad (I)$$

wherein a is 1 or 2 and q is 1, 2 or 3,
L is a divalent to heptavalent metal or non-metal,
Q is a halogen atom,
m is an integer corresponding to the sum of the values of L and q,
$R^1$ is a $\eta^6$-benzene which is unsubstituted or substituted by identical or different halogen atoms or $C_1$-$C_{12}$-alkyl, $C_2$-$C_{12}$-alkenyl, $C_2$-$C_{12}$-alkynyl, $C_1$-$C_8$-alkoxy, cyano, $C_1$-$C_{12}$-alkylthio, $C_1$-$C_6$-monocarboxylic acid ester, phenyl, $C_1$-$C_5$-alkanoyl or benzoyl groups,
$R^2$ is a cyclopentadienyl anion which is unsubstituted or substituted by identical or different $C_1$-$C_8$-alkyl, $C_2$-$C_8$-alkenyl, $C_2$-$C_8$alkynyl, $C_1$-$C_6$-monocarboxylic acid ester, cyano, phenyl, $C_1$-$C_5$-alkanoyl or benzoyl groups,
   c) at least one sensitizer for the compound of the formula I having a triplet energy of at least 30 kcal/mol, which sensitizer is chemically different from the compounds of component d), and
   d) an electron acceptor as an oxidizing agent selected from the group consisting of organic hydroperoxides, organic peracids and quinones.

2. A composition according to claim 1, wherein the weight ratio of the iron compound b) to the oxidizing agent d) is from 1:10 to 5:1.

3. A composition according to claim 1, wherein $R^2$ is monosubstituted or polysubstituted by identical or different $C_1$-$C_8$-alkyl, $C_2$-$C_8$-alkenyl, $C_2$-$C_8$-alkynyl, $C_2$-$C_6$-monocarboxylic acid ester, cyano, $C_2$-$C_5$-alkanoyl or benzoyl groups.

4. A composition according to claim 1, wherein $R^1$ is benzene, toluene, xylene, cumene, mesitylene, chlorobenzene, clorotoluene, anisole, dimethoxybenzene, biphenyl, dodecylbenzene or tetralin in the formula I.

5. A composition according to claim 1, wherein the oxidizing agent is tertiary butyl hydroperoxide, cumene hydroperroxide, triphenylmethyl hydroperoxide, tetralin hydroperoxide, α-methyltetralin hydroperoxide, decalin hydroperoxide, perbenzoic acid, m-chloroperbenzoic acid or benzoquinone.

* * * * *